United States Patent [19]
Morriss

[11] Patent Number: 6,154,060
[45] Date of Patent: Nov. 28, 2000

[54] SIGNALING CIRCUIT WITH SUBSTANTIALLY CONSTANT OUTPUT IMPEDANCE

[75] Inventor: Jeffrey C. Morriss, Cornelius, Oreg.

[73] Assignee: Intel Corporation, Santa Clara, Calif.

[21] Appl. No.: 09/089,932

[22] Filed: Jun. 3, 1998

[51] Int. Cl.[7] ........................ H03K 17/16; H03K 19/094; H03K 19/0175
[52] U.S. Cl. ................................. 326/86; 326/30
[58] Field of Search ................... 326/30, 83, 86, 326/80, 81, 49, 50, 87

[56] References Cited

U.S. PATENT DOCUMENTS

| | | | |
|---|---|---|---|
| 5,111,080 | 5/1992 | Mizukami et al. | 326/30 |
| 5,495,186 | 2/1996 | Kanazawa et al. | 326/83 |
| 5,781,028 | 7/1998 | Dacuir | 326/30 |
| 5,973,512 | 10/1999 | Baker | 326/87 |
| 5,977,797 | 11/1999 | Gasparik | 326/86 |

*Primary Examiner*—Michael Tokar
*Assistant Examiner*—Daniel D. Chang
*Attorney, Agent, or Firm*—Howard A. Skaist

[57] ABSTRACT

Briefly, in accordance with one embodiment of the invention, a driver includes: a plurality of transistors and two substantially equal impedances coupled so as to provide a relatively constant source output impedance during switching of a selected subset of transistors of the plurality. The plurality further provides the relatively constant source output impedance at each of two states of the driver output signal. In accordance with anther embodiment, a signaling circuit includes a circuit configuration including the capability to provide high speed, small swing voltage signaling and low speed, rail-to-rail voltage signaling. The circuit configuration is coupled to provide a substantially constant output impedance during high-speed signaling. In accordance with anther embodiment, a method of operating a dual mode circuit providing a substantially constant output impedance in a first operational mode of high speed, limited voltage swing signaling.

21 Claims, 1 Drawing Sheet

SIGNALING CIRCUIT WITH SUBSTANTIALLY CONSTANT OUTPUT IMPEDANCE

RELATED APPLICATION

This patent application is related to concurrently filed U.S. patent application Ser. No. 09/089,923 entitled "Method and Apparatus for High Speed Signaling" by Jeffrey C. Morriss, assigned to the assignee of the present invention and herein incorporated by reference.

BACKGROUND

1. Field

The present invention relates to circuits for use in digital signaling, for example.

2. Background

As is well-known, devices and/or peripherals may be coupled to a computer, such as a personal computer (PC), employing a signaling scheme compliant with the standard Universal Serial Bus (USB) specification, version 1.0, available from USB-IF, 2111 NE 25th. Ave. MS-JF2-51, Hillsboro Oreg. 97124 (hereinafter, "USB specification"). However, currently signals complying with the USB specification are limited to twelve (12) megabits per second and no provision has been made for increasing this bandwidth. The addition of a high speed channel may provide a number of advantages in that it might relieve a bandwidth oversubscription problem that is sometimes present with devices complying with the USB specification and, likewise, it might permit new classes of devices, which may utilize bandwidths greater than 12 megabits per second, to be coupled with devices employing a signaling scheme that complies with the USB specification.

It would, of course, be desirable to permit devices compliant with the existing or standard Universal Serial Bus specification to operate within higher bandwidth, high speed channel, while maintaining support for devices that comply with the current or standard USB specification. Existing USB specification compliant interconnection or intercoupling schemes utilize a source termination scheme. Present signaling that complies with the USB specification is rail-to-rail in voltage signal level, referring to a scheme in which the voltage signal levels of the voltage sources are realized or achieved at the output signal, and limited in bit rate so that the reflected wave of the voltage transition may traverse the cable or bus twice (e.g., in a forward and backward direction) and be absorbed back at the source. Through this mechanism, when the standard USB specification is complied with, a reflected wave that reaches a driver or circuit encounters an impedance which matches that of the cable, thereby permitting the reflected wave to be absorbed before the bus state (and hence the receiver's impedance) transitions. Unfortunately, because the rail-to-rail drivers or circuits do not provide a substantially constant impedance while switching, it is desirable for the reflected wave to reach the driver or circuit before the next bit transition. As a result, a standard USB specification compliant scheme is limited to 12 megabits per second. A need exists for a driver or signaling circuit that achieves the foregoing source termination while permitting a standard USB specification compliant scheme to support a higher bandwidth, high speed channel.

SUMMARY

Briefly, in accordance with one embodiment of the invention, a driver includes: a plurality of transistors and two substantially equal impedances coupled so as to provide a relatively constant source output impedance during switching of a selected subset of transistors of the plurality. The plurality further provides the relatively constant source output impedance at each of two states of the driver output signal.

Briefly, in accordance with another embodiment of the invention, a signaling circuit includes a circuit configuration including the capability to provide high speed, small swing voltage signaling and low speed, rail-to-rail voltage signaling. The circuit configuration is coupled to provide a substantially constant output impedance during highspeed signaling.

Briefly, in accordance with another embodiment of the invention, a method of operating a dual mode circuit providing a substantially constant output impedance in a first operational mode of high speed, limited voltage swing signaling.

BRIEF DESCRIPTION OF THE DRAWINGS

The subject matter regarded as the invention is particularly pointed out and distinctly claimed in the concluding portions of the specification. The invention, however, both as to organization and method of operation, together with objects, features and advantages thereof, may best be understood by reference to the following detailed description, when read with the accompanying drawings in which:

DETAILED DESCRIPTION

Figure 1:
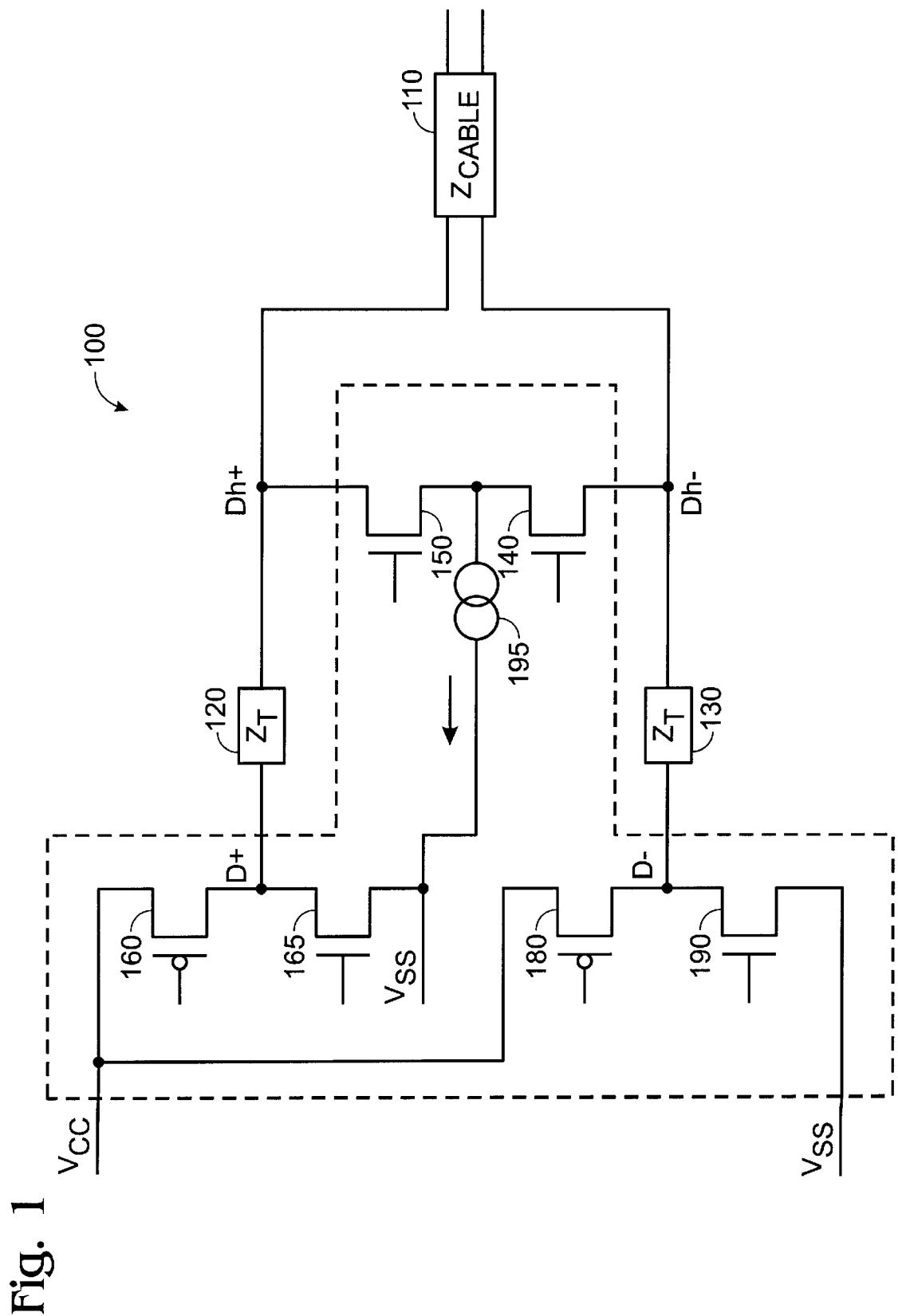
FIG. 1 is a circuit diagram illustrating an embodiment of a driver in accordance with the present invention.

In the following detailed description numerous specific details are set forth in order to provide a thorough understanding of the invention. However, it will be understood by those skilled in the art that the present invention may be practiced without these specific details. In other instances, well-known methods, procedures, components and circuits have not been described in detail so as not to obscure the present invention.

As previously described, it is desirable to implement high speed channel signaling in connection with standard USB specification compliant hosts, hubs, and other devices. For example, although the invention is not limited in scope in this respect, a 100 megabit per second channel would be desirable. A high speed channel would permit a greater aggregate bandwidth, thereby allowing the support of a greater number of devices to be coupled via a USB specification compliant bus or cable. Likewise, it would be desirable to provide "backward compatibility" in that devices complying with the standard USB specification have the capability to successfully operate with devices providing signaling at this high speed. To ensure that this occurs, it is desirable that this high speed environment support standard USB specification compliant electrical signaling, and protocol specifications.

A driver or signaling circuit complying with the standard USB specification may be source terminated. The term "source termination" implies that impedance matching is performed at the source, although the invention is not limited in scope in this respect. Therefore, the output impedance of the driver or circuit may be employed to absorb reflected waves of signals transmitted along a bus or cable. For standard USB specification compliant signaling, a constant impedance is present for the reflected wave from the start of a transition to the latest time that the reflected wave may reach the driver. USB specification compliant signaling rates and bus lines are selected to ensure that the reflected wave, therefore, reaches the driver within "one bit-time." In this context, one bit time refers to the period of a bit or binary digital signal at the particular operating frequency. Therefore, one symbol is transmitted along the bus at any given time. In this particular embodiment, it is assumed that a symbol is one bit, although, of course, the invention is not limited in scope in this respect. An advantage of employing this signaling technique is that there is little or no static power drawn by the bus signaling scheme. An artifact of source terminated rail-to-rail signaling is that, for most commonly encountered driver implementations, the output impedance of the drive may vary during switching transitions. Therefore, 12 Mbit/Sec speed switching is employed to ensure a low and relatively constant driver output impedance while the output signal of the driver is high or low, but not when the driver output signal is transitioning or switching between these two states.

Alternatively, many more symbols may be transmitted across the bus while high speed signaling is employed. Yet, during this period, it is desirable that the output impedance of the circuit or driver remain substantially constant even when the driver is switching so that any reflected signals are absorbed by impedance matching. Unfortunately, rail-to-rail switching may not easily accommodate this feature due at least in part to physical constraints employed to accomplish such signaling; however, an alternative technique providing this feature includes limited voltage swing signaling.

FIG. 1 is a circuit diagram illustrating an embodiment 100 of a driver in accordance with the present invention providing a dual mode buffer capable of meeting the electrical specifications to accomplish both rail-to-rail and limited voltage swing signaling, as explained in more detail hereinafter. Of course, the invention is not limited in scope to this particular embodiment. For example, although the transistors illustrated are metal-oxide semiconductor field effect transistors (MOSFETs), alternatively, other transistors, such as bipolar transistors, or a mix of MOSFET and bipolar transistors, for example, may be employed in alternative embodiments.

FIG. 1 illustrates a bus or cable 110 having an impedance $Z_t$. In order for impedance matching to occur for this particular embodiment, thin impedance on each coupling between cable 110 and driver 100 should comprise half of the impedance of 110. For 12 megabit per second operation, in this particular embodiment, transistors 160, 165, 180 and 190 operate as standard CMOS devices driving D+ and D− in opposite directions rail-to-rail, where D comprises the output voltage signal level for this embodiment. In this embodiment, differential signaling is employed; however, for single ended signaling, D+ and D− are driven low substantially simultaneously. In this embodiment, operated in this manner, the source output impedance comprises the sum of the impedance of one of transistors 160, 165, 180 and 190 (in this context designated $r_{on}$) and $Z_t$. It is desirable for the "on resistance" of the transistors, designated $r_{on}$, to be much smaller than $Z_t$, so that small process variations in the fabrication of the transistors, for example, do not substantially impact performance. For a 90 ohm cable, for example, the source output impedance should comprise 45 ohms. During this mode of operation of this embodiment, transistors 140 and 150 are "off" and do not conduct current. Therefore, the driver operates in this particular embodiment, in this first mode of operation, as a conventional inverter.

Embodiment 100 of a driver in accordance with the present invention includes a plurality of transistors and two substantially equal impedances, $Z_t$, coupled so as to provide a relatively constant source output impedance during switching of a selected subset of transistors of the plurality. For example, in this particular embodiment, impedances 120 and 130 are substantially equal and designated to have an impedance of $Z_t$. Of course, as previously indicated, the invention is not limited in scope to this particular embodiment. Likewise, transistors 160, 165, 180, 190, 150 and 140 are coupled as illustrated. This plurality of transistors and impedances is likewise coupled to provide the relatively constant source output impedance at each of two states, designated high and low in this particular embodiment, of the driver or buffer output signal. This mode of operation of this particular embodiment shall be explained in greater detail hereinafter. Likewise, as illustrated in FIG. 1, the driver or buffer is adapted to be coupled to voltage sources, such as $V_{cc}$ and $V_{ss}$ illustrated in FIG. 1.

As previously discussed, it is desirable in high speed signaling for a constant source output impedance to be present regardless of whether the output signal level comprises a stable state, such as high or low, or is in the process of switching because this will result in impedance matching and absorb the reflected signal from the far end. This result is accomplished in this particular embodiment using a differentially driven pair of transistors, such as 140 and 150, coupling to a substantially constant current source 135. Current source 195 may be implemented a variety of ways. The sources of 140 and 150 are coupled to an external resistor, $Z_t$ in this embodiment. In this embodiment, the gates of transistors 140 and 150 are driven differentially, yielding a limited voltage swing output signal, whose impedance is essentially that of $Z_t$ plus the resistance of a P-channel pull-up transistor in this embodiment, such as 160 and 180. In this particular embodiment, the resistance of these transistors comprises impedance $r_{on}$, which is a relatively small value compared with $Z_t$, and, therefore, realizes a substantially constant impedance, as desired. These transistors remain conducting during high speed signaling. This accomplishes the limited voltage swing in part because the bulk of the voltage drop appears across the constant current source 195. The impedance seen by each side of the cable 110 is the parallel combination of the P-channel device and $Z_t$, in parallel with a linearly driven device and a constant current source. Because a constant current source exhibits a very high impedance, the effect of the linearly driven transistor drops out, leaving $Z_t$ in series with $r_{on}$, (for the P-channel device). Therefore, the sum of the impedances of one of the pull-up transistors and $Z_t$ comprises one-half the impedance of cable 110, as desired. In this particular embodiment, of course, when the bus is floating or high speed signaling is disabled, transistors 140 and 150 are not conducting.

Embodiments of a driver in accordance with he invention, such as the embodiment previously described, provide several advantages. For example, in this particular configuration, the transistors, 140 and 150, will not be driven into saturation and will maintain operation in the linear region. In particular, due to the presence of a substantially constant current source, as illustrated in FIG. 1, the drain voltage of these transistors will change proportionally to the change in the voltage applied to the gate in order to maintain the substantially constant current.

Of course, one aspect of this embodiment of the invention is matching the impedance of the cable; however, if this impedance is not known ahead of time, it may be measured. Although an embodiment of the invention may be employed to implement the USB specification, nonetheless, the invention is not limited in scope in this respect. For example, instead of employing source termination, in an alternative embodiment, far end termination may be employed.

Yet another advantage of embodiments in accordance with the invention is that a substantially constant output impedance may be accomplished during transistor switching, such as previously described, without employing active or negative impedances. Therefore, as described previously, in this particular embodiment, the multiplexing of high-speed and low speed signals is accomplished onto a source terminated differential signaling bus.

An embodiment of a method of operating a dual mode circuit, such as the circuit shown in FIG. 1, in accordance with the present invention is as follows. A substantially constant output impedance is provided in a first operational mode of high speed, limited voltage swing signaling. A substantially constant output impedance may also be provided in a second operational mode of low speed, rail-to-rail voltage signaling only when the circuit output signal comprises the rail voltage signal levels. As previously described, in this particular embodiment the signaling comprises differential signaling, although, the invention is not limited in scope in this respect. Likewise, in one embodiment, the rail-to-rail voltage signal level may comprise at least 3.3 volts, and the peak-to-peak limited voltage swing may comprise no more than one volt in some embodiments.

While certain features of the invention have been illustrated and described herein, many modifications, substitutions, changes, and equivalents will now occur to those skilled in the art. It is, therefore, to be understood that the appended claims are intended to cover all such modifications and changes as fall within the true spirit of the invention.

What is claimed is:

1. A driver comprising:
a plurality of transistors and two substantially equal impedances to form a circuit configuration coupled so as to provide a substantially constant source output impedance during switching of a selected subset of transistors of said plurality;
said plurality is coupled to further provide said substantially constant source output impedance at each of two states of the driver output signal;
wherein each of the transistors of said plurality has a conduction impedance, and wherein the conduction impedances are substantially smaller than the impedance of the two substantially equal impedances.

2. The driver of claim 1, wherein the transistors comprise field-effect transistors (FETs).

3. The driver of claim 1, wherein said substantially equal impedances each comprise the impedance of a bus to which the driver is adapted to be coupled.

4. The driver of claim 1, wherein the conduction impedances of the transistors of said plurality are substantially equal.

5. The driver of claim 1, wherein said plurality of transistors is responsive to differential digital signaling.

6. The driver of claim 1, wherein said circuit configuration is coupled so that during switching the selected subset of transistors maintain substantially linear operation.

7. The driver of claim 1, wherein said driver is incorporated in a USB specification compliant node.

8. The driver of claim 1, wherein said circuit configuration is coupled so as to provide a substantially constant source output impedance during switching of the driver output signal between states.

9. The driver of claim 8, wherein said circuit configuration is coupled so that switching the selected subset of transistors results in switching of the driver output signal between states.

10. A signaling circuit comprising:
a circuit configuration including the capability to provide high speed, small swing voltage signaling and low speed, rail-to-rail voltage signaling;
said circuit configuration being coupled to provide a substantially constant output impedance during high-speed signaling.

11. The signaling circuit of claim 10, wherein said circuit configuration includes at least two impedances capable of being adjusted to match the impedance of a bus to which said driver is adapted to be coupled.

12. The signaling circuit of claim 10, wherein said circuit configuration is also coupled so that the circuit configuration provides the substantially constant output impedance at the rail voltage signal levels of said signaling circuit output signal.

13. The signaling circuit of claim 10, wherein said signaling circuit is incorporated in a USB specification compliant node.

14. A method of operating a dual mode circuit having two power rails that, in operation, the circuit is capable of transitioning between, said method comprising:
providing a substantially constant output impedance when at either rail and during transitions in a first operational mode of high speed, limited voltage swing signaling.

15. The method of claim 14, and further comprising:
providing the substantially constant output impedance when at either rail but not necessarily during transitions in a second operational mode of low speed, rail-to-rail voltage signaling only when the driver output signal comprise the rail voltage signal levels.

16. The method of claim 15, wherein the low speed, rail-to-rail voltage signaling comprises differential digital signaling.

17. The method of claim 16, wherein the rail-to-rail voltage signaling comprises at least approximately 3.3 volts.

18. The method of claim 17, wherein the rail-to-rail voltage signaling includes employing semiconductor devices operating in saturation mode.

19. The method of claim 14, wherein the high speed, limited voltage swing signaling comprises differential digital signaling.

20. The method of claim 14, wherein the limited voltage swing signaling comprises no more than approximately one volt peak-to-peak.

21. The method of claim 14, wherein the limited voltage signaling includes semiconductor devices operating in a linear region of operation.

* * * * *